US008440557B2

(12) United States Patent
Yokoyama et al.

(10) Patent No.: US 8,440,557 B2
(45) Date of Patent: *May 14, 2013

(54) METHOD FOR FABRICATING A SEMICONDUCTOR DEVICE BY CONSIDERING THE EXTINCTION COEFFICIENT DURING ETCHING OF AN INTERLAYER INSULATING FILM

(75) Inventors: Seiji Yokoyama, Fukushima-Ken (JP); Yuuichirou Sekimoto, Fukushima-Ken (JP); Sinichi Imada, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/840,063

(22) Filed: Jul. 20, 2010

(65) Prior Publication Data

US 2010/0279441 A1 Nov. 4, 2010

Related U.S. Application Data

(63) Continuation of application No. 12/253,035, filed on Oct. 16, 2008, now Pat. No. 7,781,320.

(30) Foreign Application Priority Data

Oct. 17, 2007 (JP) .................................. 2007-270744

(51) Int. Cl.
*H01L 21/02* (2006.01)

(52) U.S. Cl.
USPC ........... 438/585; 438/596; 438/589; 438/703; 257/E21.507; 257/E21.546; 257/E21.589; 257/E23.145

(58) Field of Classification Search .......... 438/585–638, 438/703; 257/E21.507, 546–589, 23.145
See application file for complete search history.

(56) References Cited

U.S. PATENT DOCUMENTS

| | | | | |
|---|---|---|---|---|
| 4,690,728 | A * | 9/1987 | Tsang et al. | 438/384 |
| 5,382,545 | A * | 1/1995 | Hong | 438/624 |
| 5,897,372 | A * | 4/1999 | Howard | 438/637 |
| 6,080,674 | A * | 6/2000 | Wu et al. | 438/692 |
| 6,207,556 | B1 * | 3/2001 | Hsu | 438/637 |
| 6,235,653 | B1 * | 5/2001 | Chien et al. | 438/788 |
| 6,255,717 | B1 * | 7/2001 | Babcock et al. | 257/640 |
| 6,319,568 | B1 | 11/2001 | Dai et al. | |
| 6,383,874 | B1 * | 5/2002 | Sun et al. | 438/287 |
| 6,645,868 | B1 * | 11/2003 | Babcock et al. | 438/703 |
| 6,790,772 | B2 * | 9/2004 | Chung et al. | 438/638 |
| 7,061,075 | B1 * | 6/2006 | Babcock et al. | 257/639 |
| 2002/0039836 | A1 * | 4/2002 | Venkatesan et al. | 438/622 |
| 2002/0197835 | A1 * | 12/2002 | Sun et al. | 438/585 |
| 2009/0152617 | A1 | 6/2009 | Ma et al. | |

(Continued)

FOREIGN PATENT DOCUMENTS

| | | | |
|---|---|---|---|
| EP | 265584 | * | 5/1988 |
| JP | 2002-269328 | * | 9/2000 |
| JP | 2006-202841 | * | 8/2006 |

*Primary Examiner* — Michael Lebentritt

(57) ABSTRACT

The present invention is directed to a method for manufacturing a semiconductor device by forming an ultraviolet radiation absorbing film of a silicon-rich film above a semiconductor substrate, measuring an extinction coefficient of the ultraviolet radiation absorbing film of a silicon-rich film for ultraviolet radiation, and etching the ultraviolet radiation absorbing film of a silicon-rich film under an etching condition using an oxygen gas flow rate corresponding to the extinction coefficient.

12 Claims, 9 Drawing Sheets

U.S. PATENT DOCUMENTS

2009/0232449 A1 9/2009 Zhang et al.
2010/0051096 A1 3/2010 Kim et al.
2010/0068656 A1 3/2010 Yeh et al.

* cited by examiner

METHOD FOR FABRICATING A SEMICONDUCTOR DEVICE BY CONSIDERING THE EXTINCTION COEFFICIENT DURING ETCHING OF AN INTERLAYER INSULATING FILM

CROSS-REFERENCES TO RELATED APPLICATIONS

This application is a continuation of U.S. patent application Ser. No. 12/253,035, filed on Oct. 16, 2008, entitled "Method For Fabricating a Semiconductor Device By Considering The Extinction Coefficient During Etching Of An Interlayer Insulating Film," which claims priority from Japanese patent application 2007-270744 filed on Oct. 17, 2007.

CLAIM OF PRIORITY

This application claims priority from Japanese patent application 2007-270744 filed on Oct. 17, 2007

TECHNICAL FIELD

The present invention relates to a method for manufacturing a semiconductor device, more particularly, to a method for manufacturing a semiconductor device having a silicon-rich film.

BACKGROUND ART

Conventional methods for manufacturing semiconductor devices commonly include an etching using a reactive ion etching (RIE) method and a film deposition using a plasma chemical vapor deposition (CVD) method. Both the RIE method and plasma CVD method are manufacturing methods which typically include the use of plasma.

However, when conducting a manufacturing method using plasma, ultraviolet radiation is produced. Ultraviolet radiation includes some undesirable side effects to semiconductor fabrication. For example, ultraviolet radiation is known to break a Si—O bond in silicon oxide and a Si—N bond in silicon nitride. As a solution to this problem, flash memories having an oxide-nitride-oxide (ONO) film including a charge storage layer have been provided with an ultraviolet absorbing film which absorbs ultraviolet above the ONO film have been developed. One example of this solution is disclosed in Published Japanese Translation of PCT Application No. JP-T-2007-516598).

FIG. 1A is a top view illustrating the flash memory according to the conventional solution and FIG. 1B is a cross-sectional view taken along the line A-A of FIG. 1A. With reference to FIGS. 1A and 1B, a bit line 12 which also serves as a source and a drain is formed so as to extend in a semiconductor substrate 10. An ONO film 20 composed of a tunnel insulating film 14, a charge storage layer 16 and a top insulating film 18 is formed above the semiconductor substrate 10. A word line 22 which also serves as a gate is formed on the ONO film 20, so as to extend crossing the bit line 12. An interlayer insulating film 24, an ultraviolet absorbing film 26, an anti-reflection film 28 and a cap layer 30 are formed in sequence on the word line 22. A contact hole is formed which runs through the cap layer 30, the anti-reflection film 28, the ultraviolet absorbing film 26, the interlayer insulating film 24 and the ONO film 20 and, a plug metal 32 is formed so as to be embedded in the contact hole. With such a configuration, as the ultraviolet absorbing film 26 absorbs the ultraviolet produced when forming the contact hole by an RIE method, the amount of ultraviolet that reaches the ONO film 20 is suppressed and the damage the ONO film 20 receives can be prevented.

For the ultraviolet absorbing film 26, a silicon-rich oxide film can be used. However, in the silicon-rich oxide film, when an extinction coefficient for ultraviolet (hereinafter, the extinction coefficient) is varied, an etching rate also varied. As the extinction coefficient is varied by the ratio of silicon included in the silicon-rich oxide film, a variation in extinction coefficient will result according to the conditions between devices or inside a chamber of even the same device used for depositing a silicon-rich oxide film. Therefore, an ultraviolet absorbing film 26 having various etching rates may be formed.

FIGS. 2A and 2B are cross-sectional views taken along the line equivalent to the line A-A in FIG. 1A illustrating the formation of a contact hole in a flash memory according to the conventional solution in which the ultraviolet absorbing film 26 having a desired extinction coefficient is formed.

With reference to FIGS. 2A and 2B, forming the contact hole is typically carried out in two separate etching processes. More specifically, a first etching process and a second etching process are carried out under different etching conditions. This is because, as the ultraviolet absorbing film 26 is a silicon-rich oxide film, the etching rate of the ultraviolet absorbing film 26 is slower than that of the interlayer insulating film 24 and such. In both the first etching process and the second etching process, etching is carried out with a fixed etching time.

With reference to FIG. 2A, in the first etching process, a first opening 36 is formed with a photoresist 34 formed on the cap layer 30 as a mask, by etching from the cap layer 30 down to a part of the interlayer insulating film 24. Since the extinction coefficient of the ultraviolet absorbing film 26 is of the desired value, the etching rate of the ultraviolet absorbing film 26 also becomes a desired rate. Therefore, the first opening 36 can be formed such that a bottom surface of the first opening 36 comes to a desired depth of approximately 100 nm from the border between the interlayer insulating film 24 and the ultraviolet absorbing film 26.

With reference to FIG. 2B, in the second etching process, a second opening 38 is formed which runs through the cap layer 30, the anti-reflection film 28, the ultraviolet absorbing film 26, the interlayer insulating film 24 and the ONO film 20 by etching the interlayer insulating film 24 and the ONO film 20 below the first opening 36. Consequently, a contact hole made of the second opening 38 can be formed for a desired shape.

FIGS. 3A and 3B are cross-sectional views taken along the line equivalent to the line A-A in FIG. 1A illustrating the forming of a contact hole in an alternate example of a conventional flash memory having an ultraviolet absorbing film 26 of an extinction coefficient larger than that of the desired value With reference to FIG. 3A, when the extinction coefficient of the ultraviolet absorbing film 26 is large, as the ratio of silicon included in the ultraviolet absorbing film 26 is large, the etching rate of the ultraviolet absorbing film 26 becomes small. As the etching time is fixed for forming the first opening 36, the first opening 36 may result in being formed up to halfway through the ultraviolet absorbing film 26. Under this condition, when forming the second opening 38 is carried out, as shown in FIG. 3B, the second opening 38 results in a tapered shape of which width gradually narrows towards a bottom surface.

On the other hand, when the extinction coefficient of the ultraviolet absorbing film 26 is smaller than the desired value, as the ratio of silicon included in the ultraviolet absorbing film 26 is small, the etching rate of the ultraviolet absorbing film 26 becomes large. Therefore, the depth of the first opening 36 becomes deeper than as shown in FIG. 2A. Under this condition, when forming the second opening 38 is carried out, as the etching time is fixed for forming the second opening 38, the bit line 12 formed below the second opening 38 is being etched for a longer time and the bit line 12 may get damaged.

As described above, the extinction coefficient of the ultraviolet absorbing film 26 may result in various values, therefore, the etching rate of the ultraviolet absorbing film 26 may be performed according to various rates. As shown in FIGS. 2A to 3B, the shape of the second opening 38 depends on the depth of the first opening 36, more specifically, depends on the etching rate of the ultraviolet absorbing film 26. Therefore, when the etching rate of the ultraviolet absorbing film 26 is in various rates, stably forming the second opening 38 of the desired shape is difficult. More specifically, stably forming the contact hole of the desired shape is difficult. Consequently, an electrical resistance of a contact plug formed so as to be embedded in the contact hole results in various values, and a desired electrical resistance is difficult to obtain.

FIG. 4 is a flowchart illustrating a method for manufacturing the flash memory according to a proposed solution to the above mentioned problem. FIG. 4 provides a a flash memory with a bit line 12 formed so as to extend in the semiconductor substrate 10. Above the semiconductor substrate 10, the ONO film 20 is formed by forming the tunnel insulating film 14, the charge storage layer 16 and the top insulating film 18 in sequence. On the ONO film 20, a word line 22 is formed (step S10) so as to extend crossing the bit line 12. On the word line 22, the interlayer insulating film 24 is formed (step S12).

Subsequently, in a separate batch from the manufacturing of the flash memory, the ultraviolet absorbing film 26 is formed on a dummy substrate. This may also serve as a confirmation of operations conducted every day as a daily checkup on a device used for forming the ultraviolet absorbing film 26. The extinction coefficient of the ultraviolet absorbing film 26 formed on the dummy substrate is measured. Whether the extinction coefficient is within the desired range or not is confirmed (step S14). When the extinction coefficient is within a desired range, a step S18 is proceeded to. When the extinction coefficient is not within the desired range, a film deposition condition of the ultraviolet absorbing film 26 is altered (step S16). Under the altered film deposition condition, the ultraviolet absorbing film 26 is formed on the dummy substrate and the extinction coefficient of the ultraviolet absorbing film 26 is measured again. Whether the extinction coefficient is within the desired range or not is confirmed (step S14). Until the extinction coefficient falls within the desired range, the step S16 and the step S14 are repeated.

Furthermore, the process of forming the ultraviolet absorbing film 26 on the dummy substrate and confirming whether the extinction coefficient of the ultraviolet absorbing film 26 is within the desired range or not (step S14) is not necessarily carried out after the interlayer insulating film 24 is formed (step S12), hence may be carried out before forming the interlayer insulating film 24 (step S12) or before forming the bit line 12 and such (step S10), more specifically, at any time before forming the ultraviolet absorbing film 26 (step S18) in the manufacturing of the flash memory of the third comparative example.

On the interlayer insulating film 24, the ultraviolet absorbing film 26 is formed (step S18). After the step S14, the extinction coefficient of the ultraviolet absorbing film 26 formed on the interlayer insulating film 24 is of the desired value. More specifically, the etching rate of the ultraviolet absorbing film 26 becomes the desired rate. Next, on the ultraviolet absorbing film 26, the anti-reflection film 28 and the cap layer 30 are formed in sequence (step S20).

The first opening 36 is formed (step S22) with the photoresist 34 formed on the cap layer 30 as a mask, by etching from the cap layer 30 down to a part of the interlayer insulating film 24 under a predefined etching condition. As the etching rate of the ultraviolet absorbing film 26 is of the desired rate, even when the etching time for forming the first opening 36 is fixed, the first opening 36 of the desired depth as shown in FIG. 2A can be formed.

By etching the interlayer insulating film 24 and the ONO film 20 below the first opening 36 under a predefined etching condition, the second opening 38 that runs through the cap layer 30, the anti-reflection film 28, the ultraviolet absorbing film 26, the interlayer insulating film 24 and the ONO film 20 and exposes the bit line 12 is formed (step S24). Consequently, the contact hole made of the second opening 38 is formed. The plug metal 32 is formed (step S26) by embedding a metal in the second opening 38 (the contact hole).

According to the method for manufacturing the flash memory of the third comparative example, the ultraviolet absorbing film 26 having a desired extinction coefficient can be formed. More specifically, the ultraviolet absorbing film 26 having a desired etching rate can be formed. Therefore, as the shape of the second opening 38 can be prevented from being in a tapered shape or the bit line 12 below the second opening 38 can be prevented from being damaged, the second opening 38 of a desired shape can be stably formed.

However, in the method for manufacturing the flash memory as shown in FIG. 4, until the extinction coefficient of the ultraviolet absorbing film 26 reaches the desired value, the step S14 and the step S16 must repeatedly be carried out. Accordingly, this process may become inefficient and suboptimal as a result of the repetition.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a method is provided for manufacturing a semiconductor device according to an aspect of the present invention includes forming a silicon-rich film above a semiconductor substrate, measuring an extinction coefficient of the silicon-rich film for ultraviolet, and etching the silicon-rich film under an etching condition using an oxygen gas flow rate corresponding to the extinction coefficient. This method allows the silicon-rich film to be etched at a desired etching rate.

In further embodiments, the silicon-rich film may include at least one of a silicon-rich oxide film and a silicon-rich nitride film. The embodiment may also include forming a first insulating film between the semiconductor substrate and the silicon-rich film, forming a first opening by etching a part of the first insulating film below an etched area in the silicon-rich film under an etching condition using an oxygen gas flow rate corresponding to the extinction coefficient, and forming a second opening by etching the first insulating film below the first opening under an etching condition using a predefined oxygen gas flow rate. This makes it possible to form the second opening of a desired shape. In another embodiment, the first insulating film may be an oxide film.

In still further embodiments, the method may also include forming a bit line so as to extend in the semiconductor substrate. The forming of the first opening may include forming the first opening above the bit line, and the forming of the second opening may include forming the second opening by etching the first insulating film below the first opening so as to run through the silicon-rich film and the first insulating film and expose the bit line. This makes it possible to form a contact hole made of the second opening of a desired shape on the bit line.

Other embodiments of the method may also include forming an oxide-nitride-oxide (ONO) film including a charge storage layer between the semiconductor substrate and the first insulating film, and forming an anti-reflection film on the silicon-rich film. The silicon-rich film may be an ultraviolet absorbing film that absorbs ultraviolet, and the first insulating film may be an interlayer insulating film. The forming of the first opening may include forming the first opening by etching the anti-reflection film, the ultraviolet absorbing film, and a part of the interlayer insulating film, and the forming of the second opening may include forming the second opening by etching the interlayer insulating film and the ONO film below the first opening so as to run through the anti-reflection film, the ultraviolet absorbing film, the interlayer insulating film, and the ONO film and expose the bit line. This makes it possible to form a contact hole made of the second opening of a desired shape.

The method may also include forming a wiring layer between the semiconductor substrate and the first insulating film. The forming of the first opening may include forming the first opening above the wiring layer, and the forming of the second opening may include forming the second opening by etching the first insulating film below the first opening so as to run through the silicon-rich film and the first insulating film and expose the wiring layer. This method makes it possible to form a contact hole made of the second opening of a desired shape above the wiring layer. In another embodiment, the silicon-rich film may be an anti-reflection film.

In other embodiments, the method may also include forming a plug metal by embedding metal in the second opening. This embodiment makes it possible to form a plug metal having a desired resistance value. In still further embodiments, the etching the silicon-rich film is performed with an etching gas containing hydrogen and fluorine.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the claimed subject matter, a method and system for the use of a reputation service provider, examples of which are illustrated in the accompanying drawings. While the claimed subject matter will be described in conjunction with the preferred embodiments, it will be understood that they are not intended to be limit to these embodiments. On the contrary, the claimed subject matter is intended to cover alternatives, modifications and equivalents, which may be included within the spirit and scope as defined by the appended claims.

Furthermore, in the following detailed descriptions of embodiments of the claimed subject matter, numerous specific details are set forth in order to provide a thorough understanding of the claimed subject matter. However, it will be recognized by one of ordinary skill in the art that the claimed subject matter may be practiced without these specific details. In other instances, well known methods, procedures, components, and circuits have not been described in detail as not to unnecessarily obscure aspects of the claimed subject matter.

Figure 1A:
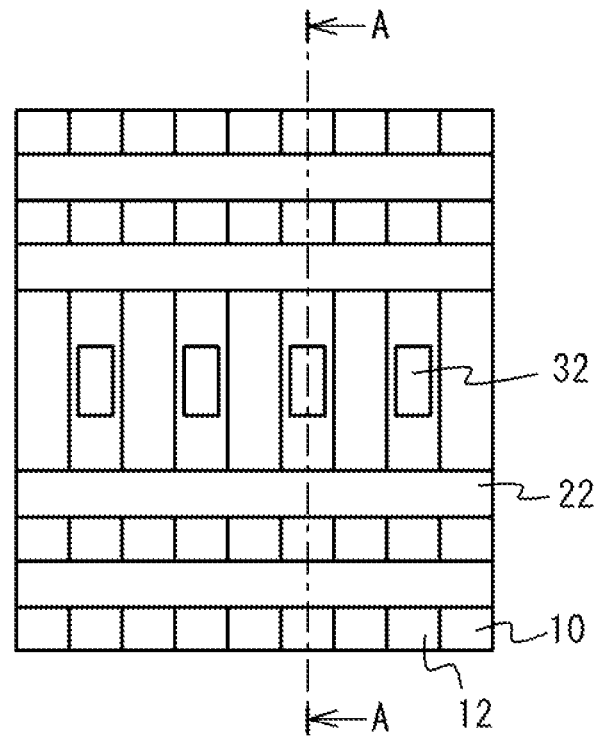
FIG. 1A is a top view of a conventional flash memory.
Figure 1B:
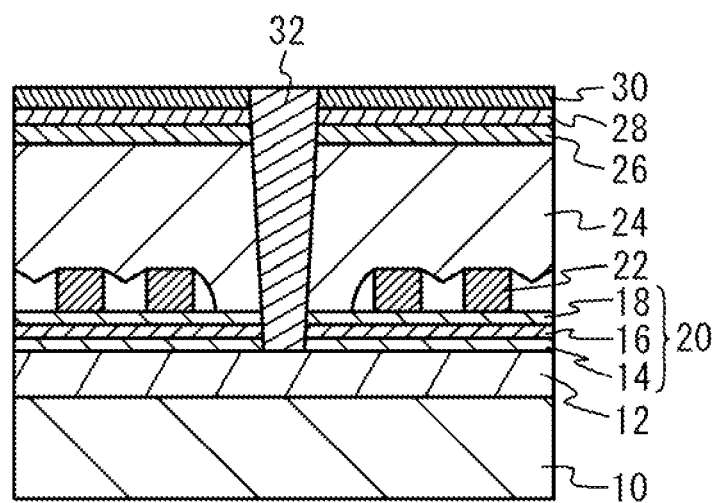
FIG. 1B is a cross-sectional view of a conventional flash memory taken along the line A-A in FIG. 1A.
Figure 2A:
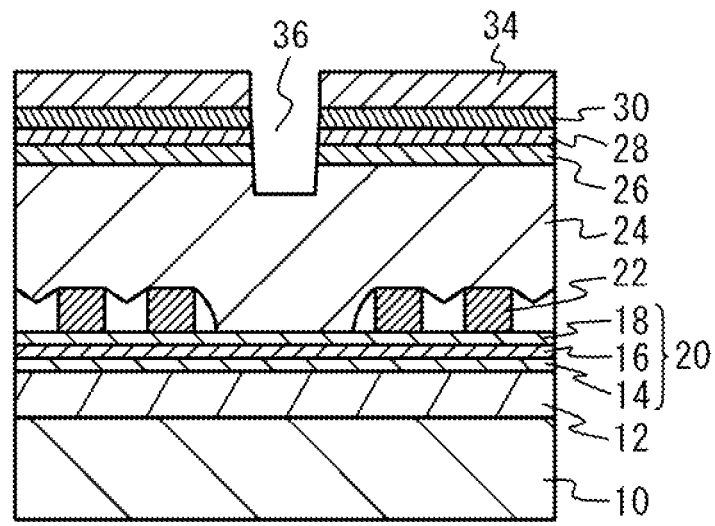
FIG. 2A is a cross-sectional view taken along the line equivalent to the line A-A of FIG. 1A to illustrate forming a first contact hole of a flash memory according to a first conventional method.
Figure 2B:
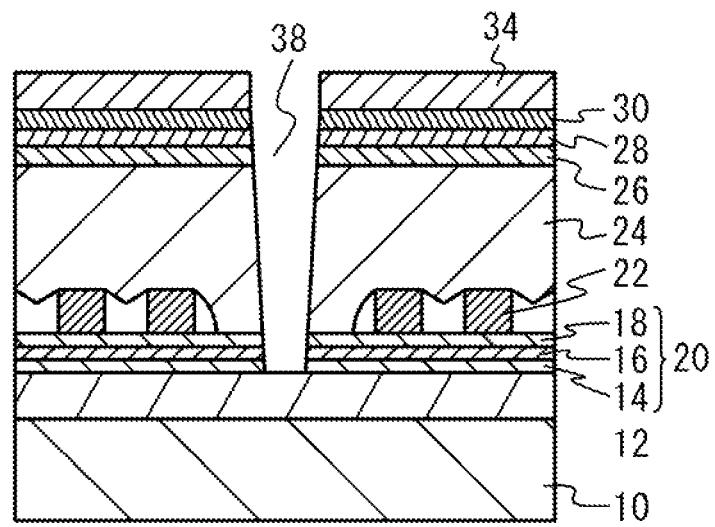
FIG. 2B is a cross-sectional view taken along the line equivalent to the line A-A of FIG. 1A to illustrate forming a second contact hole of a flash memory according to a first conventional method.
Figure 3A:
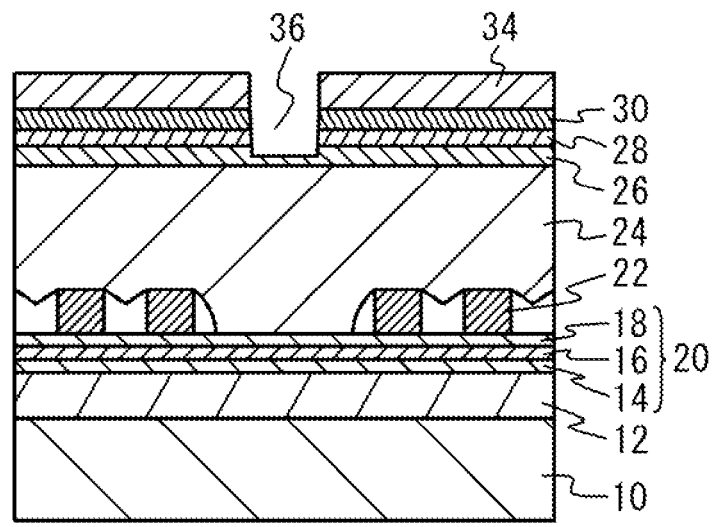
FIG. 3A is a cross-sectional view taken along the line equivalent to the line A-A of FIG. 1A to illustrate forming a first contact hole of a flash memory according to a second conventional method.
Figure 3B:
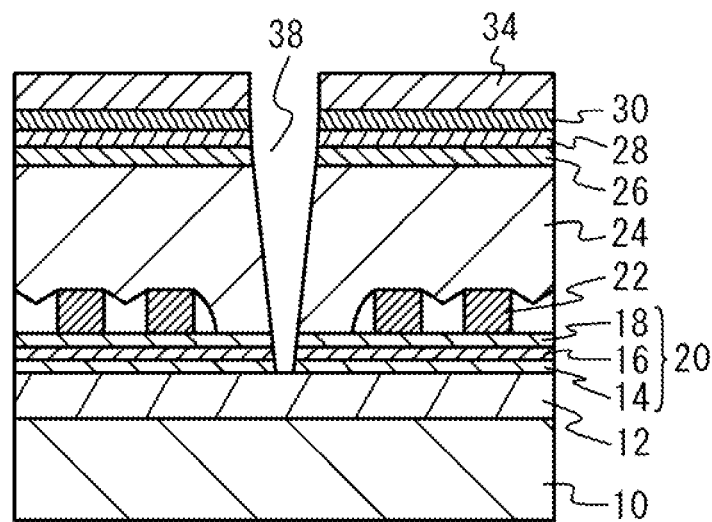
FIG. 3B is a cross-sectional view taken along the line equivalent to the line A-A of FIG. 1A to illustrate forming a first contact hole of a flash memory according to a second conventional method.
Figure 4:
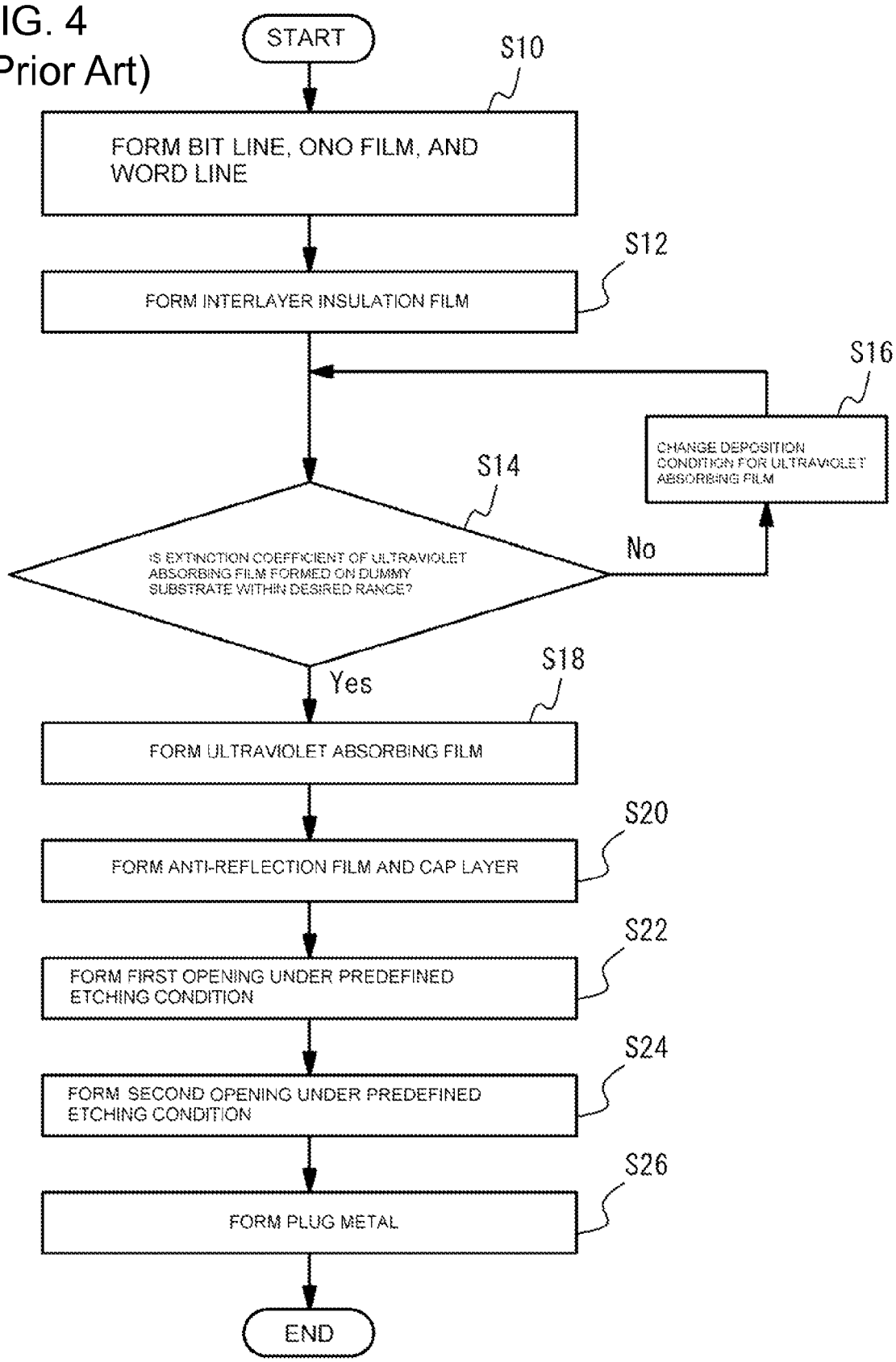
FIG. 4 is a flowchart illustrating a conventional method for manufacturing a flash memory.
Figure 5:
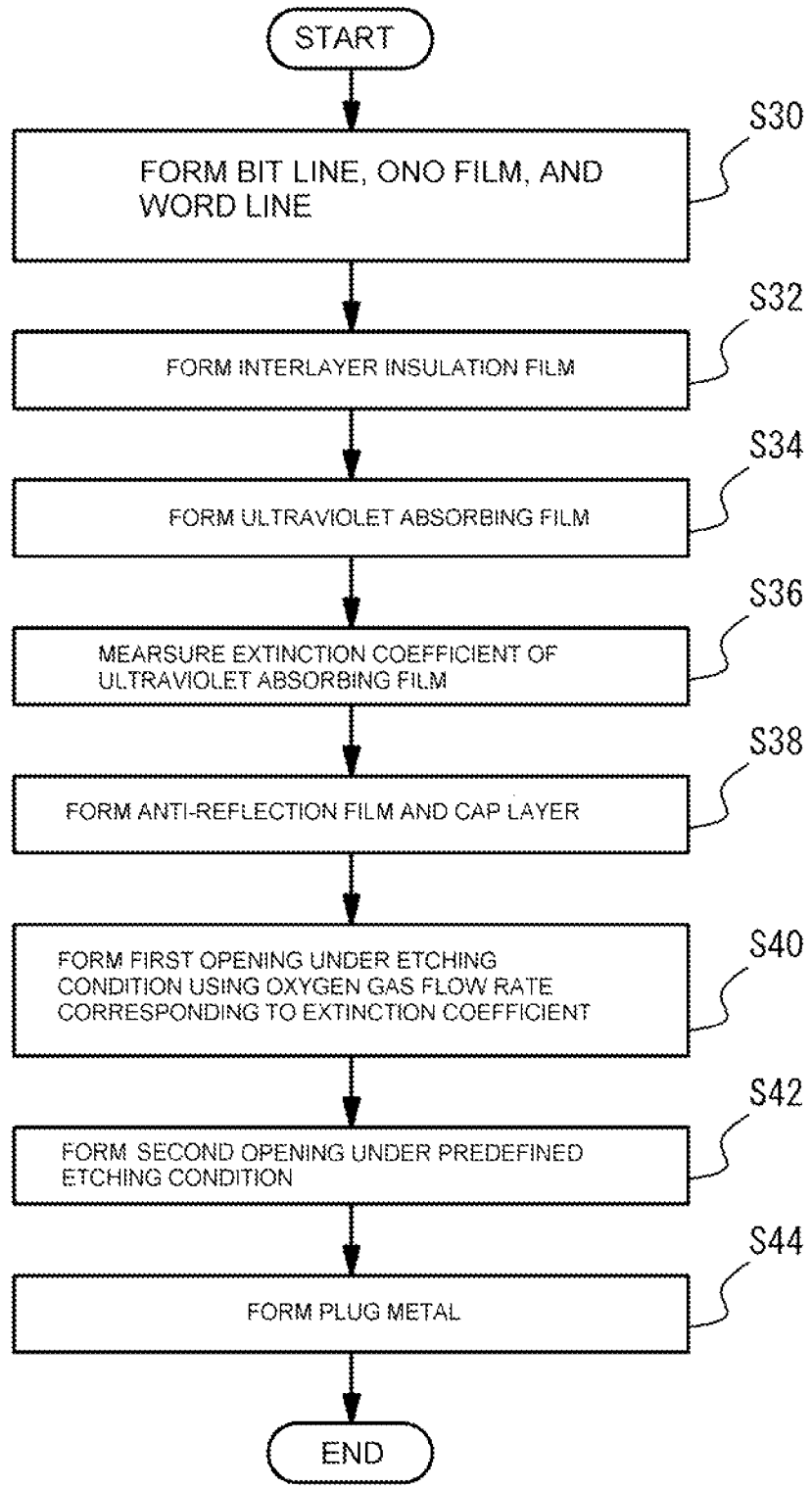
FIG. 5 is a flowchart illustrating a method for manufacturing a flash memory according to various embodiments.

FIG. 5 is a flowchart of the method for manufacturing the flash memory according to one embodiment. FIGS. 6A to 7C are cross-sectional views taken along the line equivalent to the line A-A in FIG. 1A, illustrating the method for manufacturing the flash memory.

Figure 6A:
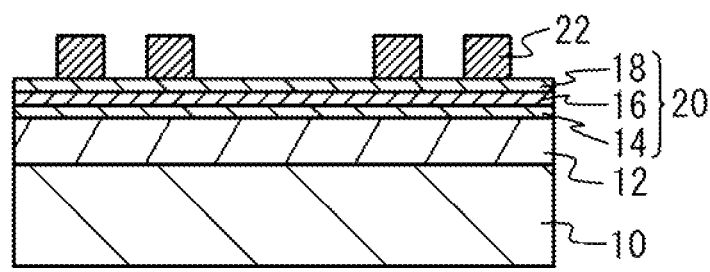
FIG. 6A is a cross-sectional view illustrating the formation of a bit line, an ONO film and a word in a method for manufacturing a flash memory according to various embodiments.

With reference to FIGS. 5 and 6A, the bit line 12 of an n-type diffusion region is formed by implanting arsenic ion in the semiconductor substrate 10 of a p-type silicon substrate so as to extend in the semiconductor substrate 10. Rhe ONO film 20 is formed above the semiconductor substrate 10, by forming the tunnel insulating film 14 of a silicon oxide film, the charge storage layer 16 of a silicon nitride film, and the top insulating film 18 of a silicon oxide film in sequence The tunnel insulating film 14 and the top insulating film 18 can be formed using a thermal oxidation method and a CVD method. The charge storage layer 16 can be formed using a CVD method. The word line 22 of a polysilicon film is formed on the ONO film 20, so as to extend crossing the bit line 12 (step S30).

Figure 6B:
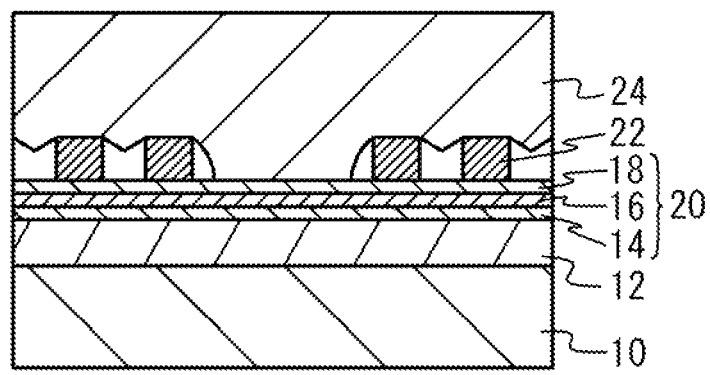
FIG. 6B is a cross-sectional view illustrating the formation of an interlayer insulation film in a method for manufacturing a flash memory according to various embodiments.

With reference to FIGS. 5 and 6B, on the word line 22, the interlayer insulating film 24 (a first insulating film) made of a boro-phosphosilicate glass (BPSG) film is formed (step S32) by using a CVD method.

Figure 6C:
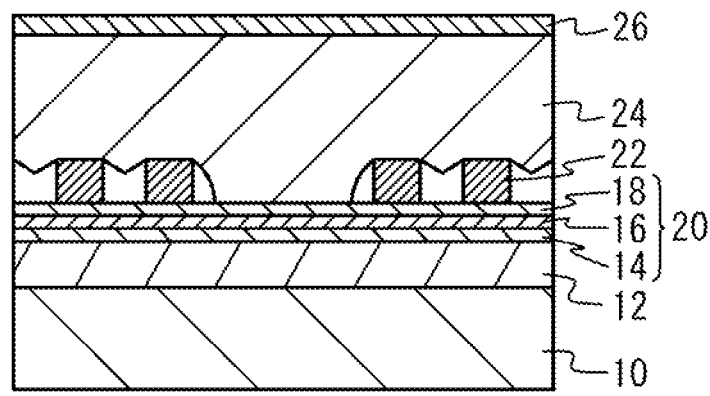
FIG. 6C is a cross-sectional view illustrating the formation of an ultraviolet absorbing film in a method for manufacturing a flash memory according to various embodiments.

With reference to FIGS. 5 and 6C, the ultraviolet absorbing film 26 of a silicon-rich oxide film is formed (step S34) on the interlayer insulating film 24 by using a CVD method. In this case, in the same batch, a monitor substrate which is used for the measurement of the extinction coefficient of the ultraviolet absorbing film 26 may be attached. With reference to FIG. 5, the extinction coefficient of the ultraviolet absorbing film 26 is measured (step S36) by an optical measurement method. The measurement of the extinction coefficient of the ultraviolet absorbing film 26 may be carried out either on a product substrate or on the monitor substrate attached in the same batch as the product substrate. When measuring the extinction coefficient of the ultraviolet absorbing film 26 on the monitor substrate, as the measurement is not limited to be carried out immediately after the ultraviolet absorbing film 26 is formed, it may be carried out after the anti-reflection film 28 is formed or after the cap layer 30 is formed. More specifically, the measurement may be carried out at any time before forming the first opening 36.

Figure 6D:
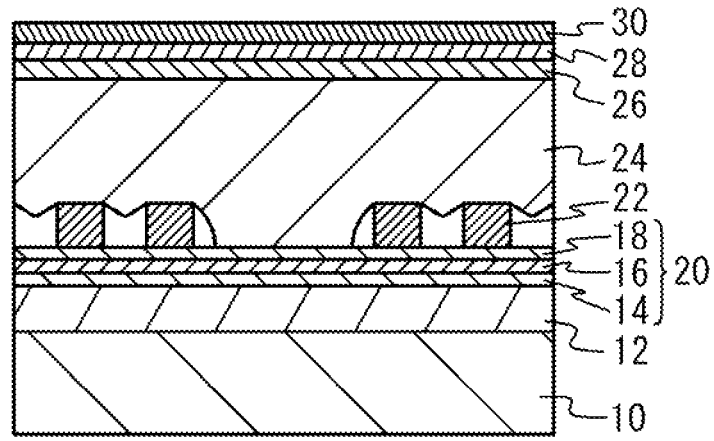
FIG. 6D is a cross-sectional view illustrating the formation of an anti-reflection film and a cap layer in a method for manufacturing a flash memory according to various embodiments.

With reference to FIGS. 5 and 6D, the anti-reflection film 28 of a SiON film and the cap layer 30 of a silicon oxide film are formed in sequence (step S38) on the ultraviolet absorbing film 26.

Figure 7A:
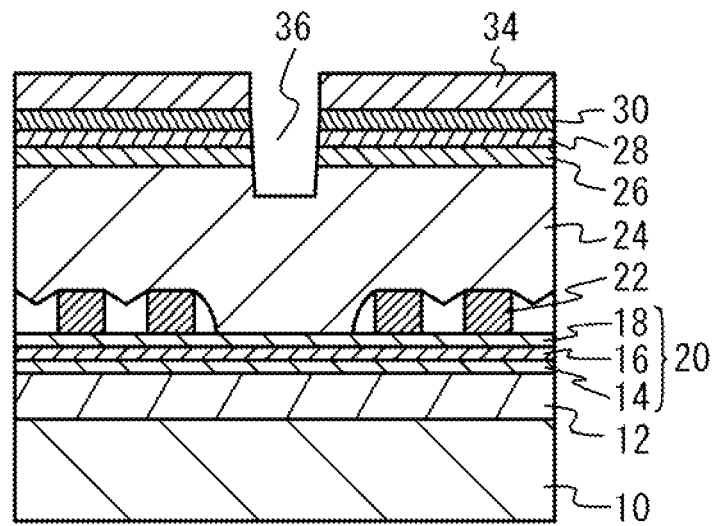
FIG. 7A is a cross-sectional view illustrating the formation of a first opening under etching conditions in a method for manufacturing a flash memory according to various embodiments.

With reference to FIGS. 5 and 7A, with the photoresist 34 formed on the cap layer 30 as a mask, the first opening 36 is formed (step S40) by using an RIE method and, by etching from the cap layer 30 down to a part of the interlayer insulating film 24 formed over the bit line 12 under an etching condition using an oxygen gas flow rate corresponding to the extinction coefficient of the ultraviolet absorbing film 26. The etching condition may comprise, for example, an etching device of a narrow gap type having an electrode spacing of 27 mm, an etching time of 140 seconds, a gas pressure of 70 mTorr, an RF power of 600 W, an argon gas flow rate of 300 sccm, a $CHF_3$ gas flow rate of 20 sccm, and an oxygen gas flow rate corresponding to the extinction coefficient of the ultraviolet absorbing film 26 can be used.

Figure 8:
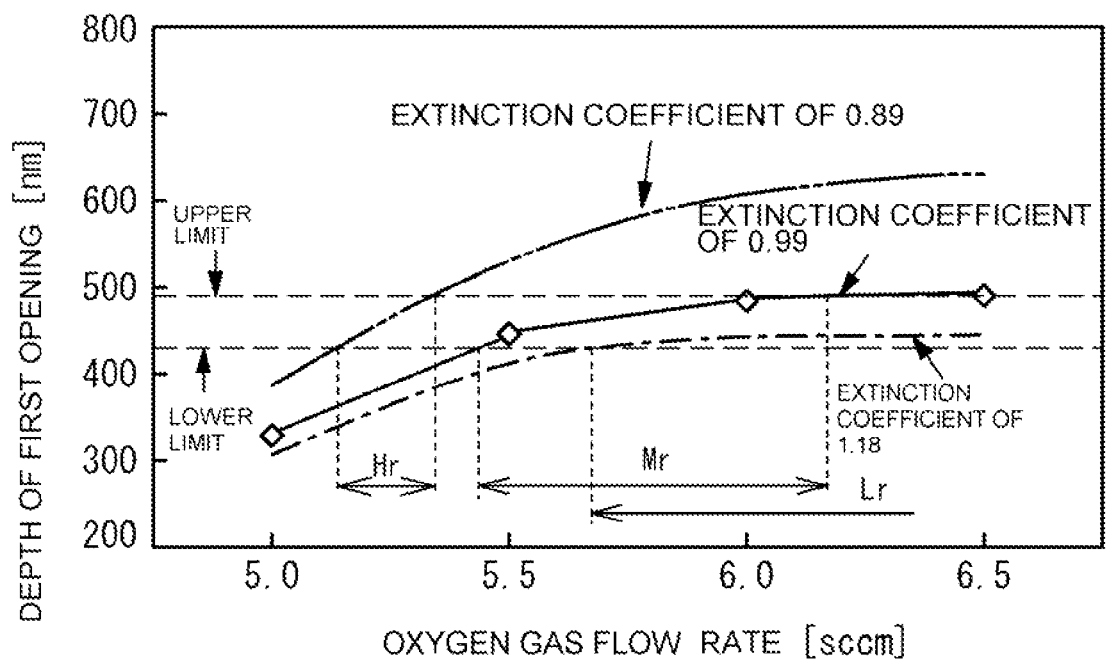
FIG. 8 shows an experiment result of changes in etching amount when altering an oxygen gas flow rate of etching condition for forming a first opening.

With reference now, in FIG. 8, an experiment result of changes in etching amount when altering the oxygen gas flow rate of the above-mentioned etching condition is shown. In FIG. 8, while the horizontal axis represents the oxygen gas flow rate, the vertical axis represents the depth of the first opening 36. While the solid line in the chart indicates the measured values of the extinction coefficient of the ultraviolet absorbing film 26 of 0.99, the single-dotted dashed line indicates the inferred values of the extinction coefficient of the ultraviolet absorbing film 26 of 1.18 and the double-dotted dashed line indicates the inferred values of the extinction coefficient of the ultraviolet absorbing film 26 of 0.89. Furthermore, the dashed lines indicate the upper limit and the lower limit of the depths of the first opening 36 of which the shape of the second opening 38 becomes the desired shape.

With reference to the solid line of the chart in FIG. 8, it can be confirmed that the depth of the first opening 36 changes by etching the ultraviolet absorbing film 26 and such with an altered oxygen gas flow rate. Therefore, in order to form the first opening 36 of the desired depth, with the extinction coefficient of the ultraviolet absorbing film 26 of 0.99 (the solid line in the chart), the oxygen gas flow rate within the range of Mr is to be used for etching may be observed. Thus, that the ultraviolet absorbing film 26 of a silicon-rich oxide film is strongly affected by the oxygen gas flow rate may be confirmed.

Further, from the solid line, single-dotted dashed line and double-dotted dashed line of the chart in FIG. 8, it can be confirmed that, when the extinction coefficient of the ultraviolet absorbing film 26 changes, the oxygen gas flow rate that allows the first opening 36 to be formed in the desired depth also changes. For example, with the extinction coefficient of the ultraviolet absorbing film 26 of 1.18 (the single-dotted dashed line), using the oxygen gas flow rate within the range of Lr can make the depth of the first opening 36 the desired depth and, with the extinction coefficient of the ultraviolet absorbing film 26 of 0.89 (the double-dotted dashed line), using the oxygen gas flow rate within the range of Hr can make the depth of the first opening 36 the desired depth. More specifically, when the oxygen gas flow rate is of a constant rate, the extinction coefficient of the ultraviolet absorbing film 26 that allows the first opening 36 of the desired depth to be formed has a certain range.

As shown in Table 1, in order to form the first opening 36 of a desired depth, when the extinction coefficient of the ultraviolet absorbing film 26 ranges from a to b, it can be determined to use the oxygen gas flow rate of X. Similarly, it can be determined, when the extinction coefficient of the ultraviolet absorbing film 26 ranges from b to c, to use the oxygen gas flow rate of Y, and when the extinction coefficient of the ultraviolet absorbing film 26 ranges from c to d, to use the oxygen gas flow rate of Z. While Table 1 shows the example of the extinction coefficients of the ultraviolet absorbing film 26 divided into 3 groups, Table 1 is used for exemplary purposes only and the number of subdivided groups may be any number according to other embodiments.

TABLE 1

| Extinction coefficient of ultraviolet absorbing film | Oxygen gas flow rate |
| --- | --- |
| a-b | X |
| b-c | Y |
| c-d | Z |

As just described, under the etching condition using the oxygen gas flow rate corresponding to the extinction coefficient of the ultraviolet absorbing film 26, by etching the ultraviolet absorbing film 26 and such to form the first opening 36, the depth of the first opening 36 can be made a desired depth. More specifically, the etching rate of the ultraviolet absorbing film 26 can be the desired rate.

Returning now to FIGS. 5 and 7B, the anti-reflection film 28, the ultraviolet absorbing film 26, the interlayer insulating film 24 and the ONO film 20 and exposes the bit line 12 is formed (step S42) by etching the interlayer insulating film 24 and the ONO film 20 below the first opening 36 under a predefined etching condition using an RIE method, the second opening 38 that runs through the cap layer 30. The predefined etching condition may comprise, for example, an etching device of a narrow gap type having an electrode spacing of 27 mm, an etching time of 135 seconds, a gas pressure of 40 mTorr, an RF power of 1700 W, an argon gas flow rate of 450 sccm, an oxygen gas flow rate of 3.0 sccm, a $C_4F_8$ gas flow rate of 14 sccm, and a CO gas flow rate of 75 sccm can be used.

Figure 7B:
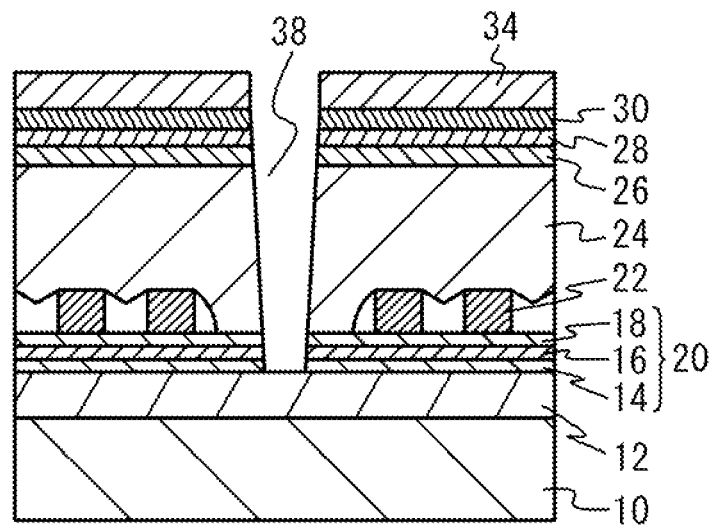
FIG. 7B is a cross-sectional view illustrating the formation of a second opening under pre-defined etching conditions in a method for manufacturing a flash memory according to various embodiments.
Figure 7C:
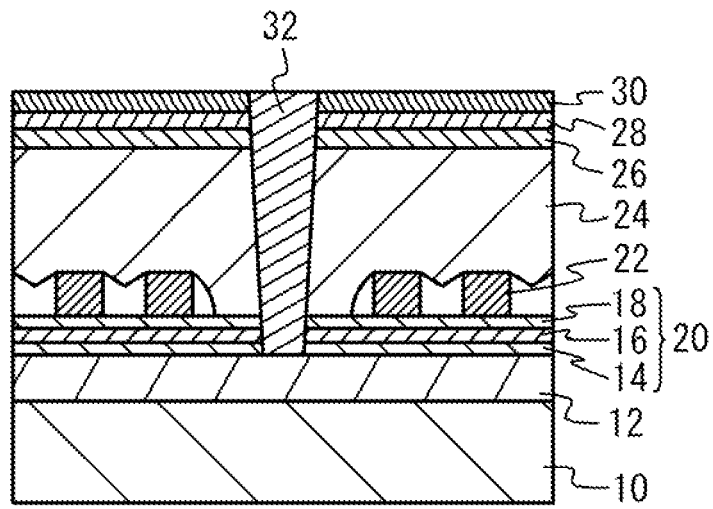
FIG. 7C is a cross-sectional view illustrating the formation of a plug metal in a method for manufacturing a flash memory according to various embodiments.

With reference to FIGS. 5 and 7C, a metal is embedded in the second opening 38. Consequently, the plug metal 32 may be formed (step S44) in the second opening 38.

According to the first embodiment, as shown in the step S34 in FIG. 5 and in FIG. 6C, the ultraviolet absorbing film 26 of a silicon-rich oxide film is formed above the semiconductor substrate 10. As shown in the step S36 in FIG. 5, the extinction coefficient of the ultraviolet absorbing film 26 for ultraviolet is measured. As shown in the step S40 in FIG. 5 and in FIG. 7A, the first opening 36 is formed under the etching condition using the oxygen gas flow rate corresponding to the extinction coefficient, by etching the ultraviolet absorbing film 26 and such. With this manufacturing method, the ultraviolet absorbing film 26 can be etched at the desired etching rate. More specifically, the first opening 36 of the desired depth can be stably formed.

The depth of the first opening 36 affects the shape of the second opening 38 when forming the second opening 38, under the etching condition using a predefined oxygen gas flow rate, by etching the interlayer insulating film 24 and such below the first opening 36 as shown in the step S42 in FIG. 5 and in FIG. 7B. Therefore, as shown in the first embodiment, when the first opening 36 of the desired depth is stably formed, the second opening 38 of the desired shape can be stably formed.

In the above embodiment, in particular, as shown in the step S40 in FIG. 5 and in FIG. 7A, the first opening 36 may be formed over the bit line 12 by etching the anti-reflection film 28, the ultraviolet absorbing film 26 and a part of the interlayer insulating film 24 over the bit line 12. As shown in the step S42 in FIG. 5 and in FIG. 7B, the second opening 38 is formed by etching the interlayer insulating film 24 and the ONO film 20 below the first opening 36 so as to run through the anti-reflection film 28, the ultraviolet absorbing film 26, the interlayer insulating film 24, the ONO film 20 and such and to expose a surface of the bit line 12. Consequently, the second opening 38 is formed on the bit line 12 and is used as a contact hole to form the plug metal 32 with which the bit line 12 and the wiring layer (not shown) are electrically coupled. More specifically, according to the first embodiment, the contact hole (the second opening 38) of the desired shape can be stably formed. As the plug metal 32 is formed so as to be embedded in the contact hole (the second opening 38), when the contact hole (the second opening 38) is stably formed to have the desired shape, the plug metal 32 having the desired resistance value can be stably obtained.

Furthermore, the ultraviolet absorbing film 26 can be etched at the desired etching rate by etching the ultraviolet absorbing film 26 under the etching condition using the oxygen gas flow rate corresponding to the extinction coefficient of the ultraviolet absorbing film 26. Therefore, as shown it is not necessary to adjust the extinction coefficient of the ultraviolet absorbing film 26 to be the desired value.

Further, the etching rate of the ultraviolet absorbing film 26 can be maintained constant by collecting and analyzing the data of etching rate of the ultraviolet absorbing film 26 depending on the relationship between the extinction coefficient of the ultraviolet absorbing film 26 and the oxygen gas flow rate and by giving feedback to the next etching of the ultraviolet absorbing film 26.

Furthermore, for example, to increase the effect of absorbing ultraviolet of the ultraviolet absorbing film 26, the extinction coefficient of the ultraviolet absorbing film 26 may be made larger. As shown in FIG. 8, when the extinction coefficient of the ultraviolet absorbing film 26 is excessively large, even if the oxygen gas flow rate is increased, there may be a case where the first opening 36 of the desired depth cannot be formed. In this case, it is necessary to control the depth of the first opening 36 by the etching time so as to be the desired depth.

In one embodiment, etching is carried out using the $CHF_3$ gas in addition to the oxygen gas, during the formation the first opening 36 shown in the step S40 in FIG. 5 and in FIG. 7A. The reason for using the $CHF_3$ gas is that, besides the ultraviolet absorbing film 26, the interlayer insulating film 24, the anti-reflection film 28 and the cap layer 30 are also simultaneously etched. Therefore, even when using a gas which contains hydrogen (H) and fluorine (F) other than the $CHF_3$ gas, by etching the ultraviolet absorbing film 26 using the oxygen gas flow rate corresponding to the extinction coefficient of the ultraviolet absorbing film 26, the etching rate of the ultraviolet absorbing film 26 can be the desired rate.

An alternate embodiment comprises an anti-reflection film of a silicon-rich SiON film being formed in between multi-layer wiring layers. With reference to FIGS. 9A to 9D, a method for manufacturing a plug metal with which the upper and lower wiring layers are coupled will be described.

Figure 9A:
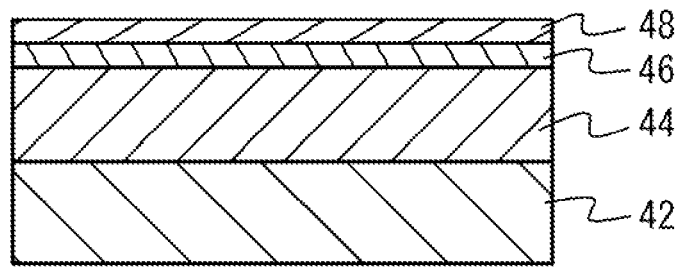
FIG. 9A is a cross-sectional view illustrating the formation of a wiring layer in a method for manufacturing a flash memory according to various embodiments.

With reference to FIG. 9A, a wiring layer 42 is formed above a semiconductor substrate (not shown). An interlayer insulating film 44 of a silicon oxide film and a cap layer 46 are formed in sequence on the wiring layer 42. Film stacks of the interlayer insulating film 44 and the cap layer 46 are collectively defined as a first insulating film. An anti-reflection film 48 of a silicon-rich SiON film is formed on the cap layer 46.

Figure 9B:
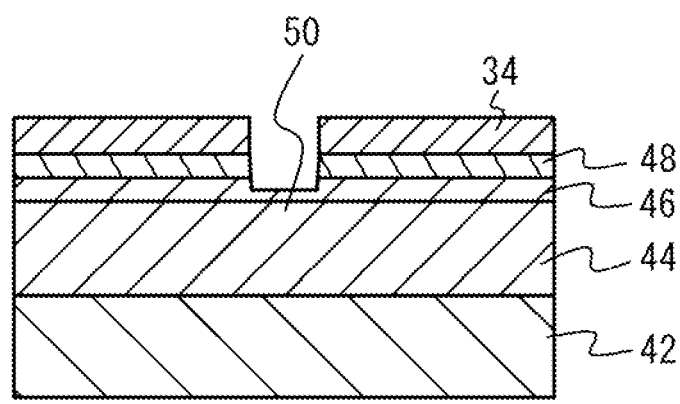
FIG. 9B is a cross-sectional view illustrating the formation of a first opening above a wiring layer in a method for manufacturing a flash memory according to various embodiments.

With reference to FIG. 9B, a first opening 50 is formed with the photoresist 34 formed on the anti-reflection film 48 as a mask, under the etching condition using the oxygen gas flow rate corresponding to the extinction coefficient of the anti-reflection film 48, the anti-reflection film 48 and a part of the cap layer 46 are etched and, above the wiring layer 42.

Figure 9C:
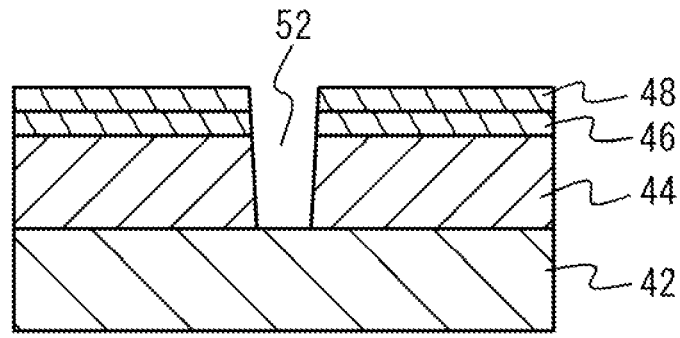
FIG. 9C is a cross-sectional view illustrating the formation of a second opening in a method for manufacturing a flash memory according to various embodiments.

With reference to FIG. 9C, the second opening 52 that runs through the anti-reflection film 48, the cap layer 46 and the interlayer insulating film 44 and exposes a surface of the wiring layer 42 is formed under the etching condition using a predefined oxygen gas flow rate, by etching the cap layer 46 and the interlayer insulating film 44 below the first opening 50. Consequently, a contact hole made of the second opening 52 is formed.

Figure 9D:
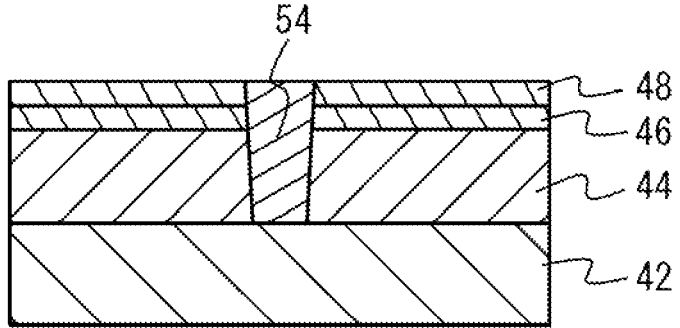
FIG. 9D is a cross-sectional view illustrating the formation of a metal embedded in the second opening in a method for manufacturing a flash memory according to various embodiments.

With reference to FIG. 9D, a metal is formed as to be embedded in the second opening 52. Consequently, in the second opening 52, the plug metal 54 is formed.

The anti-reflection film 48 of a silicon-rich SiON film is formed above the wiring layer 42. Therefore, in the same manner as the etching of the ultraviolet absorbing film 26 shown in the first embodiment, by etching under the etching condition using the oxygen gas flow rate corresponding to the extinction coefficient of the anti-reflection film 48, the etching rate of the anti-reflection film 48 can be a desired rate.

More specifically, above the wiring layer 42, the first opening 50 of a desired depth can be stably formed. Therefore, the second opening 52 (the contact hole) can be formed by etching the cap layer 46 and the interlayer insulating film 44 below the first opening 50 in a desired shape. Consequently, the plug metal 54 formed so as to be embedded in the contact hole can have a desired resistance value.

While embodiments illustrate the silicon-rich film being the silicon-rich oxide film and the second embodiment illustrates the silicon-rich film being the silicon-rich SiON film, they are not limited to these. The silicon-rich film may include at least either one of a silicon-rich oxide film or a silicon-rich nitride film. While embodiments illustrate the first insulating film being a BPSG film and the second embodiment illustrates the first insulating film being a silicon oxide film, the first insulating film may be any oxide film. In these cases, by carrying out the manufacturing method described in the first embodiment, the etching rate of the silicon-rich film can be controlled and the first opening of a desired depth can be stably formed. Consequently, the second opening of a desired shape can be stably formed.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims

The invention claimed is:

1. A method for manufacturing a semiconductor device, the method comprising:
   forming an ultraviolet absorbing film above a semiconductor substrate; and
   etching the ultraviolet absorbing film under an etching condition corresponding to an extinction coefficient of said ultraviolet absorbing film.

2. The method for manufacturing a semiconductor device according to claim 1, wherein the ultraviolet film comprises a silicon-rich film.

3. The method of manufacturing a semiconductor device according to claim 2, further comprising:
   measuring the extinction coefficient of the silicon-rich film for ultraviolet radiation;
   forming a first insulating film between the semiconductor substrate and the silicon-rich film;
   forming a first opening by etching a part of the first insulating film below an etched area in the silicon-rich film under the etching condition using an oxygen gas flow rate corresponding to the extinction coefficient; and
   forming a second opening by etching the first insulating film below the first opening under an etching condition using a predefined oxygen gas flow rate.

4. The method for manufacturing a semiconductor device according to claim 3, wherein the first insulating film is an oxide film.

5. The method for manufacturing a semiconductor device according to claim 3, further comprising:
   forming a bit line so as to extend in the semiconductor substrate; wherein
   forming of the first opening comprises forming the first opening above the bit line, and
   forming of the second opening comprises forming the second opening by etching the first insulating film below the first opening so as to run through the silicon-rich film and the first insulating film and expose the bit line.

6. The method for manufacturing a semiconductor device according to claim 5, further comprising:
   forming an oxide-nitride-oxide (ONO) film comprises a charge storage layer between the semiconductor substrate and the first insulating film;
   forming an anti-reflection film on the silicon-rich film; wherein
   the first insulating film is an interlayer insulating film, and
   forming the first opening comprises forming the first opening by etching the anti-reflection film, the ultraviolet absorbing film, and a part of the interlayer insulating film, and
   forming the second opening comprises forming the second opening by etching the interlayer insulating film and the ONO film below the first opening so as to run through the anti-reflection film, the ultraviolet absorbing film, the interlayer insulating film, and the ONO film and expose the bit line.

7. The method for manufacturing a semiconductor device according to claim 3, further comprising:
   forming a wiring layer between the semiconductor substrate and the first insulating film; wherein
   forming the first opening comprises forming the first opening above the wiring layer, and
   forming the second opening comprises forming the second opening by etching the first insulating film below the first opening so as to run through the silicon-rich film and the first insulating film and expose the wiring layer.

8. The method for manufacturing a semiconductor device according to claim 7, wherein the silicon-rich film is an anti-reflection film.

9. The method for manufacturing a semiconductor device according to claim 5, further comprising:
   forming a plug metal by embedding metal in the second opening.

10. The method for manufacturing a semiconductor device according to claim 2, wherein the silicon-rich film includes at least one of a silicon-rich oxide film and a silicon-rich nitride film.

11. The method for manufacturing a semiconductor device according to claim 1, further comprising:
    measuring the extinction coefficient of the ultraviolet absorbing film for ultraviolet radiation, wherein the etching condition comprises using an oxygen gas flow rate corresponding to the extinction coefficient.

12. The method for manufacturing a semiconductor device according to claim 2, wherein etching of the silicon-rich film is performed with a gas containing hydrogen and fluorine.

* * * * *